United States Patent [19]

Raatz et al.

[11] Patent Number: 5,497,106
[45] Date of Patent: Mar. 5, 1996

[54] BICMOS OUTPUT BUFFER CIRCUIT HAVING OVERSHOOT PROTECTION

[75] Inventors: Donovan Raatz; Taisheng Feng; Alan R. Bormann, all of Austin, Tex.

[73] Assignee: Motorola Inc., Schaumburg, Ill.

[21] Appl. No.: 308,854

[22] Filed: Sep. 19, 1994

[51] Int. Cl.$^6$ .................................................. H03K 19/003
[52] U.S. Cl. .................................. 326/30; 326/26; 326/84
[58] Field of Search .............................. 326/84, 86, 110, 326/30, 26; 327/433

[56] References Cited

U.S. PATENT DOCUMENTS

| | | | |
|---|---|---|---|
| 4,847,522 | 7/1989 | Fuller et al. | 326/84 |
| 5,184,033 | 2/1993 | Chiao et al. | 326/86 |
| 5,287,308 | 2/1994 | Oh | 365/189.06 |

Primary Examiner—Edward P. Westin
Assistant Examiner—Benjamin D. Driscoll
Attorney, Agent, or Firm—Daniel D. Hill

[57] ABSTRACT

A BICMOS output buffer circuit (20) has a voltage converter (21), a reference voltage circuit (28), a driver circuit (24), and a clamping circuit (40). The reference voltage circuit (28) receives a regulated voltage and provides a reference voltage having a low voltage level and a high voltage level. The low voltage level and the high voltage level control the logic high voltage of an output data signal. During a transition from a logic low voltage to a logic high voltage of the output data signal, the output data signal is allowed to overshoot the low voltage level. After the transition is complete, the output data signal settles at the high voltage level. This limits the amount of overshoot of the output data signal. The clamping circuit (40) dampens the oscillations of the output signal.

16 Claims, 1 Drawing Sheet

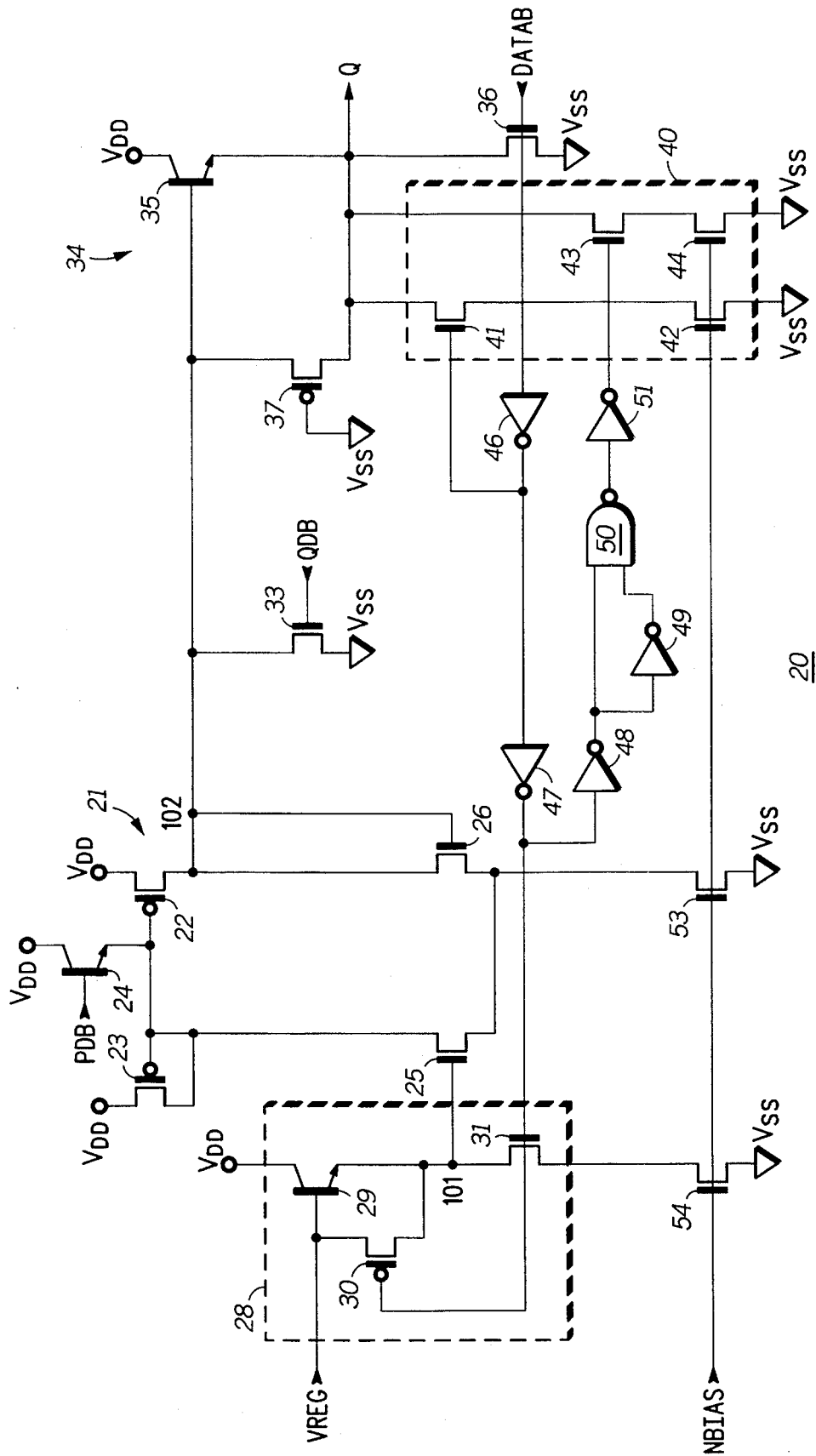
FIGURE

5,497,106

BICMOS OUTPUT BUFFER CIRCUIT HAVING OVERSHOOT PROTECTION

FIELD OF THE INVENTION

This invention relates generally to circuits, and more particularly, to a BICMOS output buffer circuit having reduced signal overshoot.

BACKGROUND OF THE INVENTION

In integrated circuits, such as microprocessors, memories, and the like, signals may be routed for relatively long distances using transmission lines. A transmission line may be a bus, a printed circuit board trace, or other type of relatively long metal line for transporting a digital signal. Typically, a printed circuit board trace has a characteristic impedance of between 50 and 75 ohms. The receiving end of the transmission line is typically connected to an input of a logic circuit having a relatively high input impedance, where the input impedance is higher than the characteristic impedance of the transmission line. A buffer circuit is coupled to the sending end of the transmission line that typically has a very low impedance relative to the receiving end. A signal transmitted along the transmission line may be reflected back to the sending end, causing the signal to overshoot a planned steady state voltage for a particular logic state. The signal may be reflected back and forth many times between the receiving end and the sending end, causing oscillatory behavior of the signal at both ends. This repeated overshooting and undershooting of the signal is commonly known as "ringing", and results in reduced noise immunity and increased time for the signal to become, and remain, valid at the receiving end.

In the past, one solution to overshoot has been to use clamping circuits to reduce the overshoot. However, clamping circuits may not respond fast enough to reduce overshoot caused by reflected signals. Also, if an integrated circuit at the sending end is supplied with a different power supply voltage (e.g. 5 volts) than the power supply voltage of an integrated circuit at the receiving end (e.g. 3 volts), the signal may be clamped at a voltage that is too high for the receiving end integrated circuit, causing reliability problems. In addition, if the receiving end of the transmission line is unterminated, or has a changing load, the signal voltage may increase to an unacceptably high voltage at the receiving end.

SUMMARY OF THE INVENTION

Accordingly, there is provided, in one form, an output buffer circuit, having a voltage converter, and first and second transistors. The voltage converter has an input terminal for receiving a reference voltage, and an output terminal for providing an output voltage directly proportional to the reference voltage. The reference voltage has a first voltage level and a second voltage level. The first transistor has a first current electrode coupled to a first power supply voltage terminal, a control electrode coupled to the output terminal of the voltage converter, and a second current electrode for providing an output signal. The second transistor has a first current electrode coupled to the second current electrode of the first transistor, a control electrode for receiving an input signal, and a second current electrode coupled to a second power supply voltage terminal. The reference voltage is provided at the first voltage level as the output signal transitions from a first logic state to a second logic state, and when the output signal is at the second logic state, the reference voltage is provided at the second voltage level. These and other features and advantages will be more clearly understood from the following detailed description taken in conjunction with the accompanying drawings.

BRIEF DESCRIPTION OF THE DRAWINGS

The FIGURE illustrates in partial schematic diagram form, and partial logic diagram form, a BICMOS output buffer circuit in accordance with the present invention.

DESCRIPTION OF THE PREFERRED EMBODIMENT

Generally, the present invention provides a BICMOS output buffer circuit that uses a first reference voltage and a second reference voltage to prevent a signal at an output terminal of the output buffer circuit from overshooting a predetermined voltage. The first reference voltage is one base-emitter diode voltage drop (VBE) below the second reference voltage. During a logic low to a logic high transition of the signal, the overshoot of the signal is reduced by the one VBE. After the transition, the second reference voltage sets the steady state voltage of the signal. Also, a clamping circuit having a relatively weak clamp and a relatively strong clamp is coupled to an output terminal of the output buffer circuit to clamp the output terminal to a predetermined voltage when the output terminal is unterminated.

The present invention can be more fully described with reference to the FIGURE. The FIGURE illustrates in partial schematic diagram form and partial logic diagram form, BICMOS output buffer circuit 20 in accordance with the present invention. BICMOS output buffer circuit 20 includes voltage converter 21, reference voltage circuit 28, clamping circuit 40, output driver 34, bipolar NPN transistor 24, N-channel MOS (metal-oxide semiconductor) transistors 33, 53, and 54, P-channel MOS transistor 37, inverters 46, 47, 48, 49, and 51, and NAND logic gate 50. Voltage converter 21 includes P-channel transistors 22 and 23, and N-channel transistors 25 and 26. P-channel transistors 22 and 23 are connected together to form a current mirror. Reference voltage circuit 28 includes NPN transistor 29, P-channel transistor 30, and N-channel transistor 31. Clamping circuit 40 includes N-channel transistors 41–44. Output driver 34 includes pull-up NPN transistor 35 and Pull-down N-channel transistor 36.

P-channel transistor 23 has a source connected to a power supply voltage terminal labeled "$V_{DD}$", and a gate and a drain connected together. P-channel transistor 22 has a source connected to $V_{DD}$, a gate connected to both the gate and drain of P-channel transistor 23, and a drain. N-channel transistor 25 has a drain connected to the drain of P-channel transistor 23, a gate connected to node 101, and a source. N-channel transistor 26 has both a gate and a drain connected to the drain of P-channel transistor 26 at node 102, and a source connected to the source of N-channel transistor 25. N-channel transistor 53 has a drain connected to the sources of both of N-channel transistors 25 and 26, a gate for receiving a bias voltage labeled "NBIAS", and a source connected to a negative power supply voltage labeled "$V_{SS}$". NPN transistor 24 has a collector connected to $V_{DD}$, a base for receiving a control signal labeled "PDB", and an emitter connected to the gates of P-channel transistors 22 and 23. Note that a signal name ending with the letter "B" is a logical complement of a signal having the same name but lacking the letter "B" at the end.

NPN transistor 29 has a collector connected to $V_{DD}$, a base for receiving a regulated voltage labeled "VREG", and an emitter connected to node 101. P-channel transistor 30 has a source connected to the base of NPN transistor 29, a gate, and a drain connected to the emitter of NPN transistor 29. N-channel transistor 31 has a drain connected to the emitter of NPN transistor 29 at node 101, a gate connected to the gate of P-channel transistor 30, and a source. N-channel transistor 54 has a drain connected to the source of N-channel transistor 31, a gate for receiving bias voltage NBIAS, and a source connected to $V_{SS}$.

N-channel transistor 33 has a drain connected to node 102, a gate for receiving a control signal labeled "QDB", and a source connected to $V_{SS}$. NPN transistor 35 has a collector connected to $V_{DD}$, a base connected to node 102, and an emitter for providing an output data signal labeled "Q". P-channel transistor 37 has a source connected to the base of NPN transistor 37 at node 102, a gate connected to $V_{SS}$, and a drain connected to the emitter of NPN transistor 35. N-channel transistor 36 has a drain connected to the emitter of NPN transistor 35, a gate for receiving an input data signal labeled "DATAB", and a source connected to $V_{SS}$.

N-channel transistor 41 has a drain connected to the emitter of NPN transistor 35, a gate, and a source. N-channel transistor 42 has a drain connected to the source of N-channel transistor 41, a gate for receiving bias voltage NBIAS, and a source connected to $V_{SS}$. N-channel transistor 43 has a drain connected to the emitter of NPN transistor 35, a gate, and a source. N-channel transistor 44 has a drain connected to the source of N-channel transistor 43, a gate for receiving bias voltage NBIAS, and a source connected to $V_{SS}$. Inverter 46 has an input terminal for receiving input data signal DATAB, and an output terminal connected to the gate of N-channel transistor 41. Inverter 47 has an input terminal connected to the output terminal of inverter 46, and an output terminal connected to the gates of both N-channel transistor 31 and P-channel transistor 30. Inverter 48 has an input terminal connected to the output terminal of inverter 47, and an output terminal. Inverter 49 has an input terminal connected to the output terminal of inverter 48, and an output terminal. NAND logic gate 50 has a first input terminal connected to the output terminal of inverter 48, a second input terminal connected to the output terminal of inverter 49, and an output terminal. Inverter 51 has an input terminal connected to the output terminal of NAND logic gate 50, and an output terminal connected to the gate of N-channel transistor 43. Inverters 46, 47, 48, 49, and 51 function as delay elements as well as inverters. N-channel transistors 42, 44, 53, and 54 function as current sources.

In operation, output buffer 20 provides output data signal Q to an output terminal of an integrated circuit having output buffer 20. Output data signal Q swings between a logic low voltage equal to about $V_{SS}$, and a logic high voltage equal to about one $V_{BE}$ below the voltage at node 102. The voltage at node 102 is directly proportional to a reference voltage at node 101. Therefore, the value of the reference voltage controls the logic high voltage of output data signal Q. The voltage level of the reference voltage at node 101 is controlled by reference circuit 28. Reference circuit 28 receives regulated voltage VREG and a delayed control signal derived from input data signal DATAB. In a preferred embodiment, regulated voltage VREG is equal to 3.3 volts. $V_{DD}$ is equal to about 5 volts, and $V_{SS}$ is equal to zero volts, or ground. The voltage at node 101 has two levels, a low level and a high level. When input data signal DATAB is a logic low, P-channel transistor 30 is conductive and N-channel transistor 31 is non-conductive, causing the reference voltage at node 101 to be equal to regulated voltage VREG (the high level). When input data signal DATAB is a logic high voltage, P-channel transistor 30 is non-conductive, N-channel transistor 31 is conductive, and the reference voltage at node 101 is equal to VREG minus one $V_{BE}$ (the low level). Control signals PDB and QDB are derived from a final amplifier (not shown) that provides input data signal DATAB, and have the same logic state as input data signal DATAB.

When input data signal DATAB is equal to a logic low voltage, N-channel transistor 36 is non-conductive and output data signal Q is a logic high voltage equal to the voltage at node 102 minus one $V_{BE}$. N-channel transistor 41 becomes conductive in response to a logic high voltage provided by inverter 46. N-channel transistors 41 and 42 provide a weak clamp for output data signal Q. After another delay provided by inverter 47, P-channel transistor 30 is conductive and N-channel transistor 31 is non-conductive, causing a voltage equal to VREG to be provided to node 101. N-channel transistor 25 is conductive and a current flows through P-channel transistor 23 and N-channel transistor 25. The current is mirrored by P-channel transistor 22 and N-channel transistor 26, so that the voltage at node 102 follows the voltage at node 101. In a preferred embodiment, the voltage at node 102 is about 0.5 volts above the voltage at node 101. Output data signal Q is equal to a logic high voltage of the voltage at node 102 minus one $V_{BE}$. N-channel transistor 43 becomes conductive for a brief period after a delay provided by inverters 46, 47, 48, and 51 and NAND logic gate 50, where inverter 49 determines how long N-channel transistor 43 is conductive. N-channel transistors 43 and 44 provide a relatively stronger clamp than N-channel transistors 41 and 42 for output data signal Q.

When input data signal DATAB is a logic high voltage, N-channel transistor 36 is conductive causing output data signal Q to be reduced to a logic low voltage. Control signal PDB is a logic high voltage, causing P-channel transistors 22 and 23 to be non-conductive. Node 102 is reduced to a low voltage equal to about $V_{SS}$. Control signal QDB is a logic high voltage that prevents NPN transistor 35 from turning on. N-channel transistors 41 and 43 become non-conductive, preventing the clamping function at the emitter of NPN transistor 35. N-channel transistor 31 is conductive and P-channel transistor 30 is non-conductive, causing the reference voltage at node 101 to be equal to VREG minus one $V_{BE}$.

When input data signal DATAB transitions from a logic high voltage to a logic low voltage, N-channel transistor 36 becomes non-conductive, allowing output data signal Q to transition from a logic low voltage to a logic high voltage. Control signal QDB is a logic low voltage, causing N-channel transistor 33 to be non-conductive. Control signal PDB is a logic low voltage causing P-channel transistors 22 and 23 to be conductive. Initially, the voltage at node 102 is at the low voltage level. After a predetermined delay provided by inverters 46 and 47, P-channel transistor 30 is conductive and N-channel transistor 31 is non-conductive, causing the high voltage level equal to about VREG to be provided to node 101. The predetermined delay is adjusted to allow node 102 to overshoot the low voltage level before increasing the voltage at node 102 to the high voltage level. In voltage converter 21, N-channel transistor 25 is conductive and a current flows through P-channel transistor 23 and N-channel transistor 25. The current is mirrored by P-channel transistor 22 and N-channel transistor 26, so that the voltage at node 102 follows the voltage at node 101. In a preferred embodiment, the voltage at node 102 is about 0.5 volts above the voltage at node 101. N-channel transistors 41 and 42 provide a weak clamp for output data signal Q. N-channel transistor 43 becomes momentarily conductive after a delay provided by inverters 46, 47, 48, and 51 and NAND logic gate 50, where inverter 49 determines how long N-channel transistor 43 is conductive. N-channel transistors 43 and 44 provide a relatively stronger clamp for output data signal Q. The clamps help to dampen oscillations of output data signal Q in the event the output terminal is unterminated. Output data signal Q only overshoots the low voltage level, instead of the high voltage level which determines the steady state voltage for a logic high.

Output buffer 20 provides the advantage of reducing signal overshoot of output data signal Q caused by reflected waves along a transmission line connected to the output terminal of output buffer 20, while maintaining a fast rise time. In addition, clamping circuit 40 provides an internal clamping function for output buffer 20 to maintain output data signal Q at a $V_{BE}$ below the voltage at node 102 when the output terminal is unterminated.

While the invention has been described in the context of a preferred embodiment, it will be apparent to those skilled in the art that the present invention may be modified in numerous ways and may assume many embodiments other than that specifically set out and described above. For example, the output buffer circuit has been described as controlling an overshoot of a signal. However, the output buffer circuit may be modified to control an undershoot of a signal by reversing the transistor conductivity types. Accordingly, it is intended by the appended claims to cover all modifications of the invention which fall within the true spirit and scope of the invention.

What is claimed is:

1. An output buffer circuit, comprising:

a voltage converter having an input terminal for receiving a reference voltage having a first voltage level and a second voltage level, and an output terminal for providing an output voltage directly proportional to the reference voltage;

a first transistor having a first current electrode coupled to a first power supply voltage terminal, a control electrode coupled to the output terminal of the voltage converter, and a second current electrode for providing an output signal;

a second transistor having a first current electrode coupled to the second current electrode of the first transistor, a control electrode for receiving an input signal, and a second current electrode coupled to a second power supply voltage terminal; and means for providing the reference voltage at the first voltage level as the input signal transitions from a first logic state to a second logic state, and when the input signal is at the second logic state, the reference voltage is provided at the second voltage level.

2. The output buffer circuit of claim 1, wherein the first voltage level is lower than the second voltage level, and the first logic state is a logic low voltage and the second logic state is a logic high voltage.

3. The output buffer circuit of claim 1, further comprising:

a third transistor having a first current electrode coupled to the first power supply voltage terminal, a control electrode for receiving a regulated voltage, and a second current electrode coupled to the input terminal of the voltage converter;

a fourth transistor having a first current electrode coupled to the control electrode of the third transistor, a control electrode for receiving a control signal, and a second current electrode coupled to the input terminal of the voltage converter; and a fifth transistor having first current electrode coupled to the input terminal of the voltage converter, a control electrode for receiving the control signal, and a second current electrode coupled to a current source.

4. The output buffer circuit of claim 3, wherein the first and third transistors are bipolar transistors and the second, fourth, and fifth transistors are MOS transistors.

5. The output buffer circuit of claim 1, further comprising a clamping circuit coupled to the second current electrode of the first transistor for damping oscillations of the output signal and maintaining the output signal at a first predetermined voltage level corresponding to the second logic state in response to the input signal being at a second predetermined voltage level.

6. The output buffer circuit of claim 5, wherein the first predetermined voltage level is equal to one base-emitter diode voltage drop below the output voltage of the output terminal of the voltage converter.

7. An output buffer circuit, comprising:

a voltage converter having an input terminal for receiving a reference voltage having a first voltage level and a second voltage level, and an output terminal for providing an output voltage directly proportional to the reference voltage;

a first transistor having a first current electrode coupled to a first power supply voltage terminal, a control electrode coupled to the output terminal of the voltage converter, and a second current electrode for providing an output signal;

a second transistor having a first current electrode coupled to the second current electrode of the first transistor, a control electrode for receiving an input signal, and a second current electrode coupled to a second power supply voltage terminal; and a clamping circuit coupled to the second current electrode of the first transistor for damping oscillations of the output signal and maintaining the output signal at a first predetermined voltage level corresponding to the second logic state, in response to the input signal being at a second predetermined voltage level;

wherein the reference voltage is provided at the first voltage level as the output signal transitions from a first logic state to a second logic state, and when the output signal is at the second logic state, the reference voltage is provided at the second voltage level.

8. The output buffer circuit of claim 7, further comprising:

a third transistor having a first current electrode coupled to the first power supply voltage terminal, a control electrode for receiving a regulated voltage, and a second current electrode coupled to the input terminal of the voltage converter;

a fourth transistor having a first current electrode coupled to the control electrode of the third transistor, a control electrode for receiving a control signal, and a second current electrode coupled to the input terminal of the voltage converter; and a fifth transistor having first current electrode coupled to the input terminal of the voltage converter, a control electrode for receiving the control signal, and a second current electrode coupled to a current source.

9. The output buffer circuit of claim 7, wherein the clamping circuit comprises:

a third transistor having a first current electrode coupled to the second current electrode of the first transistor, a control electrode for receiving a control signal, and a second current electrode; and a fourth transistor having a first current electrode coupled to the second current electrode of the third transistor, a control electrode for receiving a bias voltage, and a second current electrode coupled to the second power supply voltage terminal.

10. The output buffer circuit of claim 7, wherein the first transistor is a bipolar transistor and the second transistor is a MOS transistor.

11. The output buffer circuit of claim 7, wherein the voltage converter comprises:

a current mirror having a first output terminal and a second output terminal;

a third transistor having a first current electrode coupled to the first output terminal of the current mirror, a control electrode for receiving the reference voltage, and a second current electrode; and a fourth transistor having a first current electrode and a control electrode both coupled to the second output terminal of the current mirror, and a second current electrode coupled to the second current electrode of the third transistor.

12. The output buffer circuit of claim 7, wherein the first voltage level is lower than the second voltage level, and the first logic state is a logic low voltage and the second logic state is a logic high voltage.

13. A BICMOS output buffer circuit, comprising:

a current mirror having a first output terminal and a second output terminal;

a first MOS transistor having a first current electrode coupled to the first output terminal of the current mirror, a control electrode for receiving a reference voltage, and a second current electrode;

a second MOS transistor having a first current electrode and a control electrode both coupled to the second output terminal of the current mirror, and a second current electrode coupled to the second current electrode of the first MOS transistor;

a first bipolar transistor having a first current electrode coupled to a first power supply voltage terminal, a control electrode coupled to the second output terminal of the current mirror, and a second current electrode for providing an output signal;

a third MOS transistor having a first current electrode coupled to the second current electrode of the first bipolar transistor, a control electrode for receiving an input signal, and a second current electrode coupled to a second power supply voltage terminal;

wherein the reference voltage is provided at a first voltage level as the output signal transitions from a first logic state to a second logic state, and when the output signal is at a second logic state, the reference voltage is provided at a second voltage level; and a clamping circuit coupled to the second current electrode of the first bipolar transistor for damping oscillations of the output signal and maintaining the output signal at a first predetermined voltage level corresponding to the second logic state, in response to the input signal being at a second predetermined voltage level.

14. The BICMOS output buffer circuit of claim 13, wherein the first voltage level is lower than the second voltage level, and the first logic state is a logic low voltage and the second logic state is a logic high voltage.

15. The BICMOS output buffer circuit of claim 13, further comprising:

a second bipolar transistor having a first current electrode coupled to the first power supply voltage terminal, a control electrode for receiving a regulated voltage, and a second current electrode coupled to the control electrode of the first MOS transistor;

a fourth MOS transistor having a first current electrode coupled to the control electrode of the second bipolar transistor, a control electrode for receiving a control signal, and a second current electrode coupled to the control electrode of the first MOS transistor; and a fifth MOS transistor having first current electrode coupled to the control electrode of the first MOS transistor, a control electrode for receiving the control signal, and a second current electrode coupled to a current source.

16. The BICMOS output buffer circuit of claim 13, wherein the clamping circuit comprises:

a fourth MOS transistor having a first current electrode coupled to the second current electrode of the first bipolar transistor, a control electrode for receiving a control signal, and a second current electrode; and a fifth MOS transistor having a first current electrode coupled to the second current electrode of the fourth MOS transistor, a control electrode for receiving a bias voltage, and a second current electrode coupled to the second power supply voltage terminal.

* * * * *